United States Patent
Naji

[19]

[11] Patent Number: 5,852,574
[45] Date of Patent: Dec. 22, 1998

[54] HIGH DENSITY MAGNETORESISTIVE RANDOM ACCESS MEMORY DEVICE AND OPERATING METHOD THEREOF

[75] Inventor: Peter K. Naji, Tempe, Ariz.

[73] Assignee: Motorola, Inc., Schaumburg, Ill.

[21] Appl. No.: 998,366

[22] Filed: Dec. 24, 1997

[51] Int. Cl.$^6$ .................................................. G11C 11/00
[52] U.S. Cl. .......................... 365/158; 365/171; 365/173
[58] Field of Search ................................ 365/158, 171, 365/172, 173

[56] References Cited

U.S. PATENT DOCUMENTS

| | | | |
|---|---|---|---|
| 4,829,476 | 5/1989 | Dupuis | 365/158 |
| 5,587,943 | 12/1996 | Torok | 365/158 |
| 5,699,293 | 12/1997 | Tehrani | 365/158 |
| 5,745,406 | 4/1998 | Yamane | 365/158 |

FOREIGN PATENT DOCUMENTS

000507451 A  10/1992  European Pat. Off. ............... 365/158

*Primary Examiner*—Son Mai
*Attorney, Agent, or Firm*—William E. Koch

[57] ABSTRACT

A high density magnetoresistive random access memory (MRAM) device is provided. The MRAM device includes a plurality of magnetic memory cells which employ a giant magnetoresistive effect to read and write states. The magnetic memory cells are divided into groups as memory units. The memory unit is activated by row and column signals provided by row and column decodes, respectively. Then, sense and word currents is applied to a target magnetic memory cell.

23 Claims, 4 Drawing Sheets

HIGH DENSITY MAGNETORESISTIVE RANDOM ACCESS MEMORY DEVICE AND OPERATING METHOD THEREOF

FIELD OF THE INVENTION

The present invention relates to a magnetoresistive random access memory device and an operating method thereof, and more particularly, to the device having memory modules including a plurality of magnetic memory cells.

BACKGROUND OF THE INVENTION

A magnetoresistive random access memory device (MRAM), which is one of non-volatile memory devices, includes a plurality of magnetic memory cells employing the giant magnetoresistive (GMR) effect. It is known that the GMR effect appears in multi-layer films which are alternately stacked by magnetic layers and non-magnetic layers. Magnetic resistance over a magnetic memory cell indicates a minimum value when magnetic vectors in magnetic layers point in a same direction, and a maximum value when magnetic vectors point in an opposite direction. The same and opposite directions of magnetic vectors are called "parallel" and "antiparallel", respectively. When GMR material is employed for a memory device, parallel and antiparallel directions, for example, are defined as a logic "0" and a logic "1", respectively.

The MRAM device normally arranges magnetic memory cells on intersections of word and sense lines. The MRAM circuits for example, is described in U.S. patent application Ser. No. 08/728,023 entitled "A METHOD OF OPERATING A RANDOM ACCESS MEMORY DEVICE HAVING A PLURALITY OF PAIRS OF MEMORY CELLS AND THE MEMORY DEVICE", filed Oct. 9, 1996 assigned to the same assignee.

Activation of a word line and a sense line enables the read and write states in the memory cell. The sense line is directly coupled to the memory cells in series and a sense current flows in the magnetic layers so that a sense current is affected by magnetic vectors in the magnetic layers and the current value is alternated according to the direction of magnetic vectors. Sensing the changes in the sense current value allows one to detect states stored in the memory cell. On the other hand, a writing process is carried out by applying enough magnetic field to switch magnetic vectors in the magnetic layers. The word and sense currents both create a total magnetic filed to the memory cell which stores states in the memory cell in accordance with directions of the word current.

In high density MRAM arrays, many memory cells are coupled to the sense line. This means that the sense line includes more memory cells in series, thereby a total resistance increase over the sense line. As the resistance increases, an output voltage of the sense current source increases to keep the sense current constant. The high output voltage causes the sense current source to stop providing the sense current because of an overvoltage under requirements of the sense current source. Further, increasing the number of series memory cells coupled to a sense line makes the word line length longer and consequently the total resistance of the word line higher. That exceeds the cutoff requirements to the word current source against an overvoltage It is needed to limit the number of the memory cells to which a single current source supplies a current.

Accordingly, it is a purpose of the present invention to provide an improved MRAM device having high density memory cells.

It is another purpose of the present invention to provide an improved MRAM device having a low power consumption.

It is still another purpose of the present invention to provide an improved MRAM device having high-speed read and write operations.

It is a further purpose of the present invention to provide an improved MRAM device operating at a lower power supply voltage.

SUMMARY OF THE INVENTION

These needs and others are substantially met through provision of a magnetoresistive random access memory (MRAM) device which includes a plurality of pairs of memory modules. Each memory module includes memory units arranged in rows and columns having a plurality of magnetic memory cells. The magnetic memory cell employs a giant magnetoresistive effect to sense and store states in the magnetic memory cell. Magnetic memory cells are placed on intersections of word and sense lines. In order to access a target magnetic memory cell, row and column signals are provided so that a memory unit is activated. Then, sense and word current are provided on sense and word lines to apply a total magnetic field to the target magnetic memory cell.

DETAILED DESCRIPTION OF THE PREFERRED EMBODIMENTS

Figure 1:
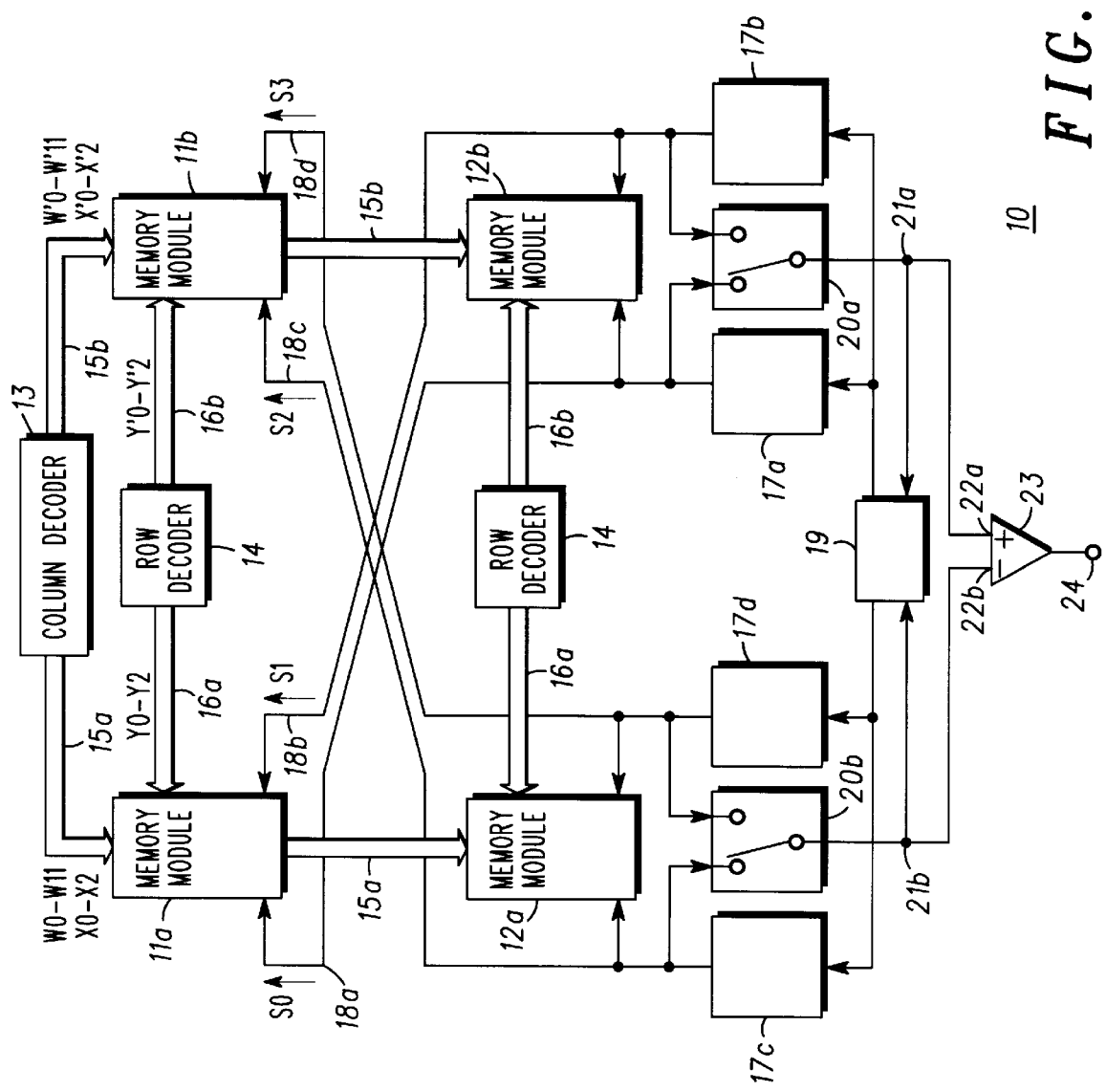
FIG. 1 shows a block diagram of an MRAM device.

FIG. 1 shows a block diagram of a magnetoresistive random access memory (MRAM) device 10, in which two pairs of memory modules 11a and 11b, and 12a and 12b are arranged, for example. It should be noted that more pairs of memory modules can be arranged in accordance with a total amount of memory cells in the MRAM device. Memory modules 12a and 12b have the same structure as memory modules 11a and 11b. For instance, memory module 11a includes a plurality of memory units arranged in a matrix which contain a plurality of magnetic memory cells for storing states. The details of the memory module are explained in FIG. 2 hereinafter.

Since memory modules 12a and 12b have the same structure as memory modules 11a and 11b, operations and connections for only memory modules 11a and 11b are described. A column decoder 13 and a row decoder 14 are coupled to memory modules 11a and 11b, respectively. These decoders provide signals decoded from an address signal (not shown) to select target and reference cells in a pair of memory modules. Column decoder 13 decodes address information on an address bus (not shown) to provide word signals W0–W11 and column signals X0–X2 on line 15a and word signals W'0–W'11 and column signals X'0–X'2 on line 15b, respectively. Row decoder 14 decodes the address information to provide row signals Y0–Y2 on line 16a and row signals Y'0–Y'2 on line 16b. Sense current sources 17a–17d provide sense currents S0–S3 through sense lines 18a–18d to memory modules 11a and 11b, respectively. These word, column, row, and sense signals are employed to access a memory cell for reading and writing operations.

An equalizer 19, which includes a decoder for selecting a sense line, is coupled to sense current sources 17a–17d to control sense currents S0–S3 on sense lines 18a–18d. Further equalizer 19 controls switches 20a and 20b to connect a line 21a to sense line 18a or 18b, and a line 21b to sense line 18c or 18d. Equalizer 19 adjusts voltages on sense lines coupled to a pair of memory modules so as to be equal before a sensing operation. Input terminals 22a and 22b of a comparator 23 are coupled to memory modules 11a or 11b, and 12a or 12b through switches 20a and 20b. Comparator 23 compares a voltage on a positive input 22a coupled to a target memory cell in memory module 11a to a voltage on a negative input 21b coupled to a reference memory cell in memory module 11b to provide an output voltage on an output terminal 24. Output terminal 24 normally is coupled to a data bus line.

Figure 2:
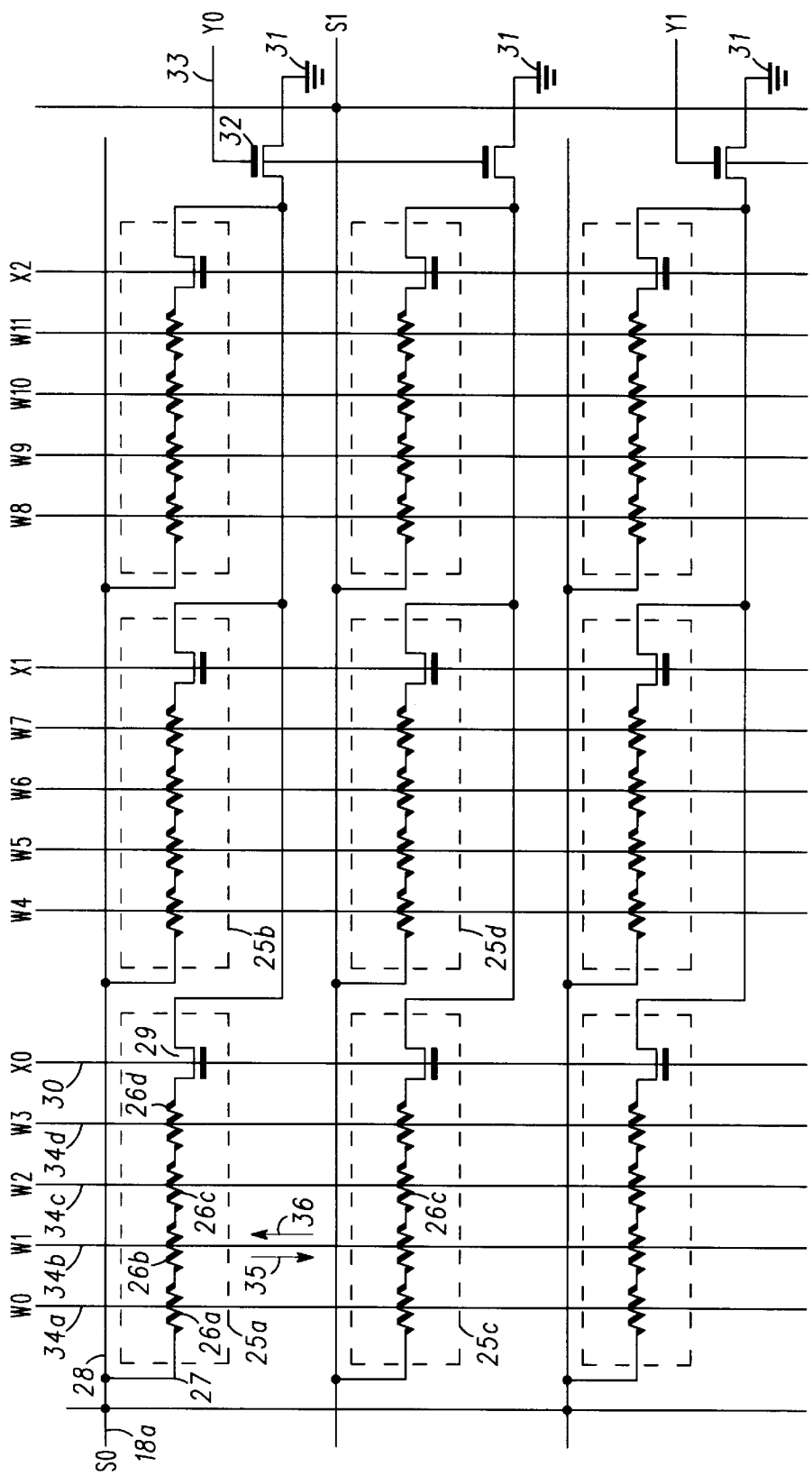
FIG. 2 shows a detailed circuit of a memory module according to this invention.

Referring to FIG. 2, a detail circuit of memory module 11a is illustrated. Memory modules 11b, 12a, and 12b in FIG. 1 have the same circuit configuration as memory module 11a. Memory module 11a includes a plurality of memory units arranged in a matrix. Although memory module 11a shows nine memory units 25a, 25b, 25c, 25d, . . . , it should be noted that more memory units can be expanded according to the amount of the memory capacity. The memory unit contains a plurality of magnetic memory cells where information is stored. The structure and characteristics of the magnetic memory cell are shown in FIGS. 3 and 4, the details of which are described hereinafter.

Memory unit 25a, for example, has four magnetic memory cells 26a–26d connected in series. It is appreciated that the magnetic memory cells can increase according to the total memory size. Memory cells 26a–26d are coupled to a local bit line 27 which is connected through a global bit line 28 to sense line 18a. Global bit line 28 provides a sense current S0 from sense line 18a to each memory unit. Memory unit 25a further includes a first or unit switch 29 which is coupled to memory cells 26a–26d in series. Unit switch 29, which is controlled by column signal X0 on column line 30, is further coupled to a common potential or ground terminal 31 through a second or row switch 32. Unit switch 29 together with row switch 32 enables sense current S0 to flow from sense line 18a through global bit line 28, local bit line 27, memory cells 26a–26d, unit switch 29, and row switch 32 to ground terminal 31. Word lines 34a–34d are placed adjacent memory cells 26a–26d, respectively, to apply a magnetic field to each magnetic memory cell.

The memory module arranges a plurality of memory units in a matrix. The increase of the number of not only the magnetic memory cells in the memory unit but the memory units allows the MRAM device to expand a total memory capacity according to the need. Since the magnetic memory cells are divided into a plurality of memory units, the number of memory cells in a memory unit (total resistance of a memory unit) can be designed to comply with the specified low supply voltage such that a sense current source operates within its required terminal voltage with a high output impedance. The ability to use a lower power supply voltage leads to low power consumption. Further, it reduces memory cell signal attenuation and the RC time constant of a sense line.

Figure 3:
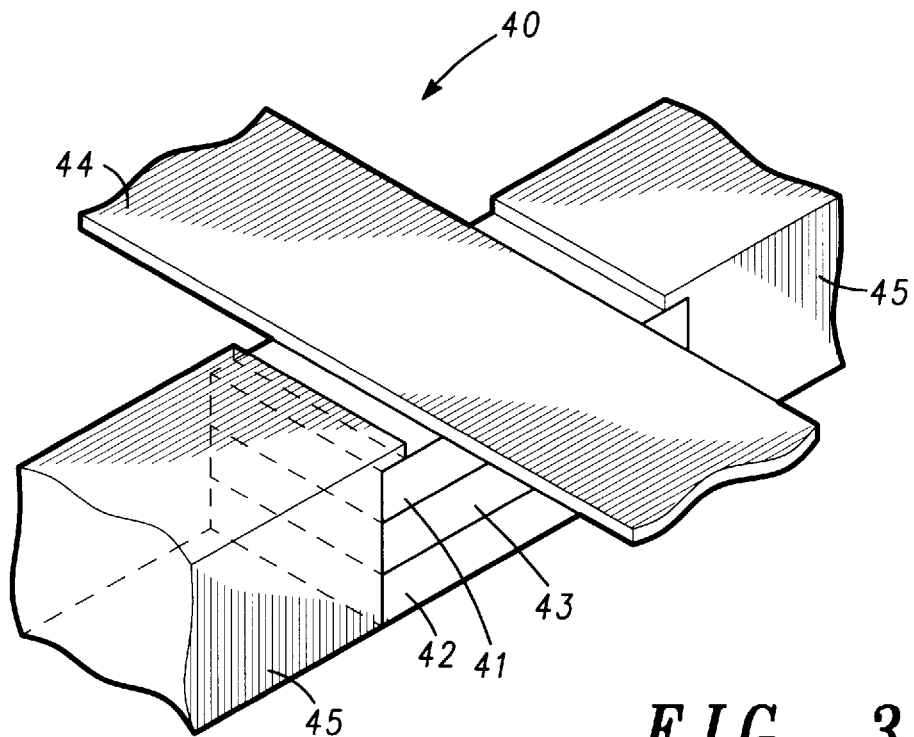
FIG. 3 is an isometric view of a simplified and enlarged MRAM cell structure.
Figure 4:
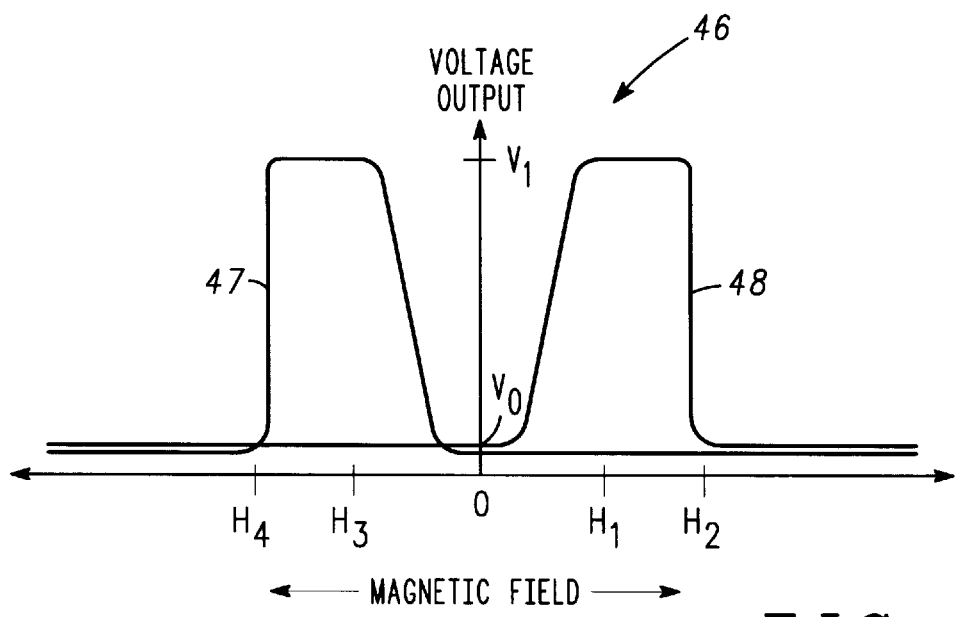
FIG. 4 shows a graph illustrating characteristics of the MRAM cell shown in FIG. 3.

FIG. 3 shows an isometric view of a simplified and enlarged structure of a memory cell 40 having multiple layers of magnetic material Other memory cells also have the same structure as memory cell 40. Memory cell 40 has a first magnetic layer 41 and a second magnetic layer 42 separated by a conductive layer 43. Layers 41 and 42 utilize magnetic material such as NiFeCo, and conductive layer 43 utilizes, for example, Copper (Cu). The three layers 41–43 together form a giant magneto-resistive (GMR) material. Word line 44, which carries a word current, is placed adjacent first layer 41 in order to provide the GMR material with a magnetic field generated by the word current. Sense line 45, which carries a sense current, is connected to the GMR with an ohmic contact to sense a magnetic resistance In order to store or write a state in magnetic cell 40, a total magnetic field, which is created by magnetic fields provided by the word current and the sense current sufficient to switch the direction of magnetic vectors in magnetic layers 41 and 42, is applied to magnetic layers 41 and 42. To read the state in magnetic cell 40, a voltage on sense line 45 is sensed because the voltage changes according to the direction of magnetic vectors in magnetic layers 41 and 42.

FIG. 4 shows a graph 46 illustrating the resistance or voltage output of magnetic cell 40 (FIG. 3) verses the applied magnetic field or total magnetic field. The abscissa indicates magnetic field direction and strength, that is, the strength either supports or opposes the magnetic vectors of cell 40. The ordinate represents the voltage output of cell 40. A curve 47 indicates the magnetoresistance characteristic, via the output voltage, for various magnetic field intensities for one direction of magnetization vectors. A curve 48 indicates the magnetoresistance characteristic, via the output voltage, for the same magnetic field intensities for the opposite direction of magnetization vectors. To the right of zero, curves 47 and 48 indicate the output voltage for magnetic fields that support the vectors of curve 47 and oppose the vectors of curve 48, and magnetic fields to the left of zero support the vectors of curve 48 and oppose the vectors of curve 47. Typically, curves 47 and 48 cross the voltage axis at the same point and have the same minimum values. For the sake of explanation, curve 48 is shifted vertically a slight amount to show the differences between the curves.

At zero applied field, the voltage output ($V_0$) of cell 40 is approximately the same regardless of the magnetization vector direction. As the field increases from zero to $H_1$, curve 48 shows the voltage output of cell 40 having vectors that are opposed by the total magnetic field, and curve 47 shows the voltage of cell 40 having vectors that are supported by the magnetic field. At magnetic field intensity of $H_1$, the magnetic vectors in memory cell 40 rotate and indicate the output voltage $V_1$. As the total magnetic field intensity increases between $H_1$ and $H_2$, the magnetic vectors of memory cell 40 continue to rotate and snap to the other direction near a field intensity of $H_2$. Near $H_2$, the vectors of memory cell 40 snap to the opposite direction and the resistance decreases for values of $H_2$ and above. Similarly, the output voltage for an opposite direction total magnetic field is shown between zero and $H_3$ to $H_4$.

Referring to FIGS. 1 and 2 again, the operation of the MRAM device is described below. In order to read states in magnetic memory cell (target cell) 26b in FIG. 2, for example, an equalization step is carried out first. The equalization step sets voltages on sense lines 18a and 18c equal, applying a magnetic field at an intensity of $H_3$ shown in FIG. 4 to target cell 26b. First of all, equalizer 19 turns on sense current sources 17a and 17c to provide sense current S0 on sense line 18a and sense current S2 on sense line 18c, respectively. Then, column decoder 13 provides word current W1 having a direction indicated as an arrow 35 on line 34b (FIG. 2) to apply magnetic field $H_3$ (FIG. 4) to target cell 26b.

Next, column decoder 13 provides column signal X0 on line 30 to turn on column switch 29 and column signal X'0 for the reference cell in memory module 11b. Then, row decoder 14 sends row signal Y0 on line 33 to turn on row switch 32, and row signal Y'0 for the reference cell in memory module 11b, thereby sense current S0 flows from sense current source 17a through sense line 18a, global bit line 28, local bit line 27, memory cell 26b, unit switch 29, and row switch 32 to common terminal 31. Sense current S0 creates a voltage drop over target cell 26b according to a magnetic resistance of target cell 26b. Also a voltage drop generated by sense current S2 appears on sense line 18c. Equalizer 19 controls switches 20a and 20b to connect lines 21a and 21b to lines 18a and 18c, respectively, so that the voltages on both lines 18a and 18c are introduced through switch 20a and 20b into equalizer 19 Equalizer 19 compares these voltages and adjusts sense currents S0 and S2 until the voltages on sense lines 18a and 18c are equal.

After the equalization process, column decoder 13 provides word current W1 having an opposite direction indicated by an arrow 36 to apply a magnetic field $H_1$ in FIG. 4 to target cell 26b. Then, comparator 23 compares voltages appearing on lines 18a and 18c through switches 20a and 20b. When a voltage on line 18a increases, target cell 26b has a high magnetic resistivity accordance to curve 48 in FIG. 4. Accordingly, comparator 23 provides a high voltage on output terminal 24 which can be defined as a logic "1", for instance. When the voltage on line 18a decreases, target cell 26b indicates a low magnetic resistivity as curve 47 shows in FIG. 4, which introduces a low voltage on output terminal 24. That can be defined as a logic "0".

Referring to FIGS. 1 and 2 again, in a writing operation, when a logic "1" is stored in memory cell 26b, sense current S0 is provided on sense line 18a from sense current source 17a. After that, decoder 13 gives word current W1 having a direction indicated by arrow 35, for instance, on word line 34b. Then, unit switch 29 and row switch 31 are turned on by column signal X0 from column decoder 13 and row signal Y0 from row decoder 14. Word current W1 and sense current S0 generate magnetic fields which are combined to produce a total magnetic field. The total magnetic field is more than or equal to magnetic field $H_4$ so that magnetic vectors in magnetic cell 26b are switched to an antiparallel direction.

When a logic "0" is written in magnetic cell 24b, decoder 13 provides word current W1 having an opposite direction indicated by arrow 36 to generate a total magnetic field more than or equal to $H_2$. The total magnetic field allows magnetic vectors in magnetic cell 24b to be switched to a parallel direction.

Figure 5:
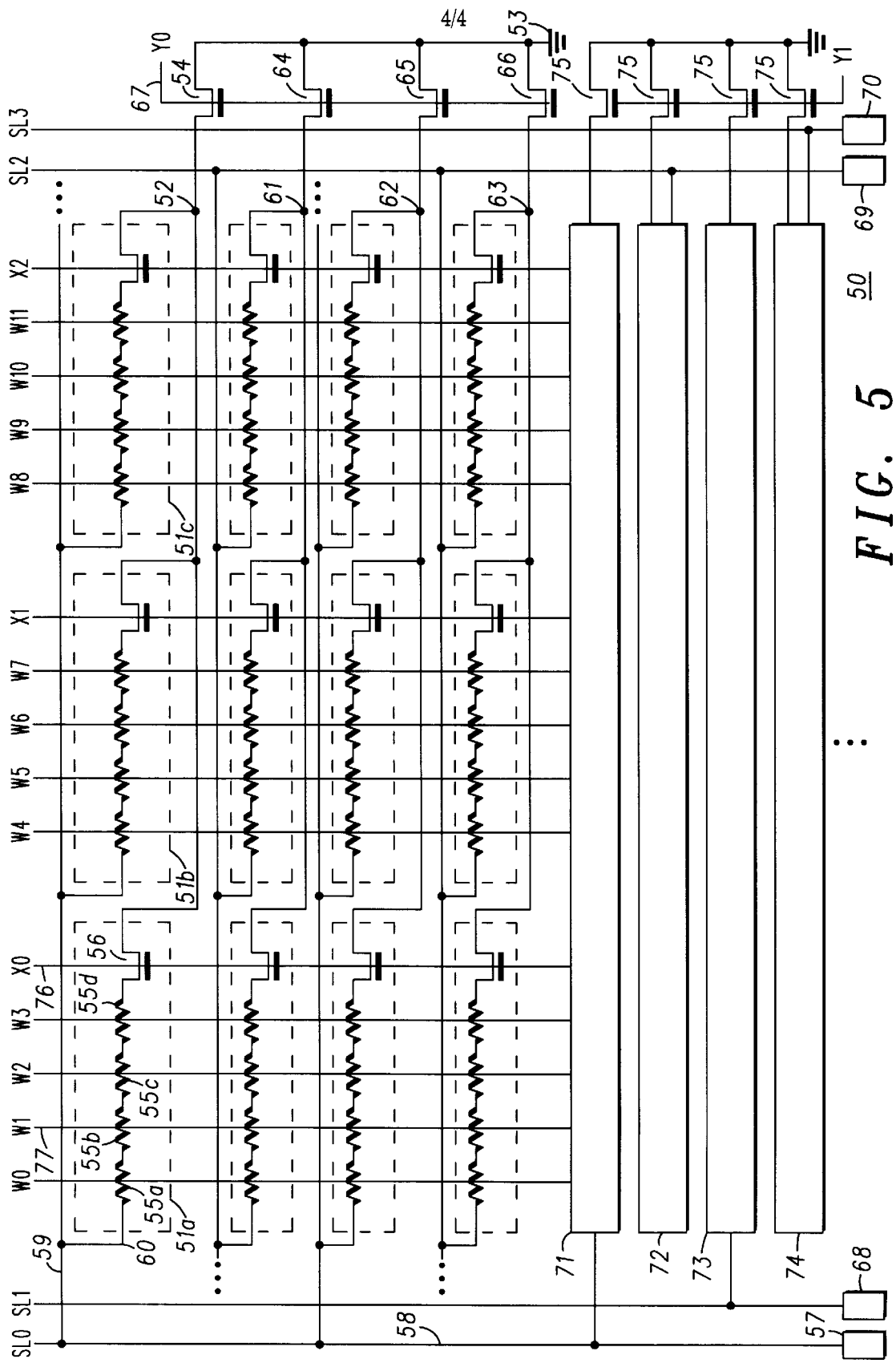
FIG. 5 shows a circuit diagram illustrating another embodiment of this invention.

Referring to FIG. 5, another embodiment of the invention is illustrated for a memory module. A memory module 50 has the same circuit structure as memory module 11a in FIG. 2 except that memory units in the memory module are divided into a plurality of unit groups and all the memory units in a unit group are activated by a control signal from the row decoder.

Memory units 51a, 51b, 51c, ..., are coupled to row line 52 which further is coupled to a ground or common terminal 53 through a row switch 54. Memory unit 51a, for example, includes a plurality of magnetic memory cells 55a–55d which are connected to a column switch 56 in series as well as the other memory units. Each memory unit is coupled to a sense current source, for example, memory unit 51a is coupled to a sense current source 57 through a sense line 58, a global bit line 59 and a local bit line 60. In FIG. 5, four row lines 52 and 61–63 are formed as one group and coupled to row switches 54 and 64–66, respectively. Gate electrodes of row switches 54 and 64–66 are tied in common to a control line 67. A control signal Y0 on control line 67 from row decoder 14 controls row switches 54 and 64–66 to allow sense current SL0–SL3 to flow from sense current sources 57 and 68–70, respectively. Boxes 71–74 form another unit group, each box includes memory units as well and are connected to a row signal Y1 through row switches 75. It should be noted that more unit groups can be formed for expansion of memory units.

Memory module 50 basically operates in the same way as memory module 11a in FIG. 2 except selecting the unit group. As mentioned earlier for memory module 11a, the same equalization steps are carried out for memory module 50 and a voltage drop on sense line 58 is sensed to evaluate states in the target memory cell. When memory cell 55b is selected, for instance, sense current source 57 is initiated to provide sense current SLO on sense line 58 which is given to memory unit 51a through global bit line 59 and local bit line 60. Then, row decoder 14 sends a control signal Y0 on control line 67, which turns on row switches 54 and 64–66. Next, column decoder 13 applies column signal X0 on column line 76 to turn on column switch 56. Finally word signal W1 is provided on word line 77. The above process allows magnetic memory cell 55b to be activated and sense current SLO to flow in cell 55b.

Since the memory module is divided into a plurality of unit groups, the memory module attains a high density integration of memory cells. As shown in FIG. 5, every four row switches share one control signal, e.g. Y0 from row decoder 14. As a result, more area is available for the layout of row decoder 14 drivers, resulting in a small row decoder, and hence improving array efficiency.

In another embodiment, the number of sense current sources and sense lines can be increased by a factor of 2 for a higher array efficiency. This would be suitable for a very high density MRAM. In general, the number of sense lines and current source can increase in factors of 2, 4, 8, 16 in a binary fashion, $2^n$.

What is claimed is:

1. A magnetoresistive random access memory module comprising:
    memory units being arranged in rows and columns, each of the memory units having a plurality of magnetic memory cells;
    a plurality of row lines, each row line being coupled to memory units lined in the row;
    a plurality of column lines, each column line being coupled to memory units lined in the column; and
    a plurality of second switches, each second switch being coupled to the row line to activate the memory units lined in the row.

2. The magnetoresistive random access memory module as claimed in claim 1 further including a plurality of word lines and a plurality of sense lines, the magnetic memory cells being arranged on intersections of the word lines and the sense lines.

3. The magnetoresistive random access memory module as claimed in claim 2 further including:
    a first decoder for providing a row signal on the row line, the row signal activating memory units lined in the row; and
    a second decoder for providing a word current on the word line and a column signal on the column line, the column signal activating memory units lined in the column and the word line activating the memory cell in the memory unit selected by the row and column signals.

4. The magnetoresistive random access memory module as claimed in claim 1 wherein the plurality of magnetic memory cells are coupled to in series.

5. The magnetoresistive random access memory module as claimed in claim 1 wherein the memory unit further includes a first switch coupled to the column and row lines to activate the memory unit.

6. The magnetoresistive random access memory module as claimed in claim 5 wherein the first switch is coupled to the magnetic memory cells in the memory unit in series.

7. The magnetoresistive random access memory module as claimed in claim 1 wherein the magnetic memory cell includes magnetic layers separated by non-magnetic layer.

8. A magnetoresistive random access memory module comprising:
   memory units being arranged in rows and columns, each of the memory units having a plurality of magnetic memory cells;
   a plurality of row lines, each row line being coupled to memory units lined in the row;
   a plurality of column lines, each column line being coupled to memory units lined in the column; and
   a plurality of second switches that are grouped by groups of second switches, each second switch being coupled to the row line, and each group of second switches being coupled to a control line.

9. The magnetoresistive random access memory module as claimed in claim 8 further including a plurality of word lines and a plurality of sense lines, the magnetic memory cells being arranged on intersections of the word lines and the sense lines.

10. The magnetoresistive random access memory module as claimed in claim 9 further including:
    a first decoder for providing the control signal on the control line, each control signal providing row signals on the group of row lines and activating memory units coupled to the group of row lines; and
    a second decoder for providing a word current on the word line and a column signal on the column line, the column signal activating memory units lined in the column and the word line activating the memory cell in the memory unit selected by the row and column signals.

11. The magnetoresistive random access memory module as claimed in claim 8 wherein the plurality of magnetic memory cells are coupled to in series.

12. The magnetoresistive random access memory module as claimed in claim 8 wherein the memory unit further includes a first switch coupled to the column and row lines to activate the memory unit.

13. The magnetoresistive random access memory module as claimed in claim 12 wherein the first switch is coupled to the magnetic memory cells in the memory unit in series.

14. The magnetoresistive random access memory module as claimed in claim 8 wherein the magnetic memory cell includes magnetic layers separated by non-magnetic layer.

15. A magnetoresistive random access memory device comprising:
    at least a pair of memory modules, each module having memory units being arranged in rows and columns, and each memory unit having a plurality of magnetic memory cells;
    a decoder for activating the magnetic memory cell;
    a detector for sensing states contained in the magnetic memory cell; and
    an equalizer for adjusting the sense lines at a predetermined voltage.

16. The magnetoresistive random access memory device as claimed in claim 15 wherein the decoder includes a first decoder and a second decoder, the first decoder activating the memory units lined in the row and the second decoder activating the memory units lined in the column and magnetic memory cells in the memory unit.

17. The magnetoresistive random access memory device as claimed in claim 15 wherein the detector compares an output from a target memory cell in one memory module of the pair of memory modules to an output from a reference memory cell in the other memory module of the pair of memory modules, both cells being activated by the decoder.

18. The magnetoresistive random access memory device as claimed in claim 15 wherein the equalizer sets a same voltage on the sense lines.

19. The magnetoresistive random access memory device as claimed in claim 15 wherein the plurality of magnetic memory cells are coupled to in series.

20. The magnetoresistive random access memory device as claimed in claim 15 wherein the magnetic memory cell includes magnetic layers separated by non-magnetic layer.

21. An operating method for a magnetoresistive random access memory device having memory units being arranged in rows and columns, each of the memory units having a plurality of magnetic memory cells, the method comprising the steps of:
    activating the memory unit;
    activating the magnetic memory cell in the memory unit;
    applying a sense current to the magnetic memory cell; and
    equalizing an output from the magnetic memory cell before sensing states in the magnetic memory cell.

22. The operating method for the magnetoresistive random access memory device as claimed in claim 21 wherein the step of activating the memory unit includes the steps of:
    activating the memory units lined in the row; and
    activating the memory units lined in the column.

23. The operating method for the magnetoresistive random access memory device as claimed in claim 21 wherein the step of activating the magnetic memory cell in the memory unit includes a step of providing a word current and applying a magnetic field created by the word current to the magnetic memory cell.

* * * * *

UNITED STATES PATENT AND TRADEMARK OFFICE
CERTIFICATE OF CORRECTION

PATENT NO.     : 5,852,574
DATED          : December 22, 1998
INVENTOR(S)    : Naji It is certified that error appears in the above-identified patent and that said Letters Patent is hereby corrected as shown below:

<u>Column 1,</u>
Line 4, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*